(12) United States Patent
Yang

(10) Patent No.: US 6,748,085 B1
(45) Date of Patent: Jun. 8, 2004

(54) COMPUTER SYSTEM WITH A COMMON AUDIO INPUT FOR ITS AUDIO CIRCUITRY

(75) Inventor: Sung-Dong Yang, Maetan 3 cha (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/306,447

(22) Filed: May 6, 1999

(30) Foreign Application Priority Data

May 6, 1998 (KR) .............................................. 98-16206

(51) Int. Cl.[7] .................................................. H04H 5/00
(52) U.S. Cl. ............................ 381/11; 381/12; 381/123
(58) Field of Search ............................. 381/1, 11, 12, 381/123, 74, 28, 300

(56) References Cited

U.S. PATENT DOCUMENTS 4,433,209 A * 2/1984 Kurosawa ...................... 381/1
5,056,148 A    10/1991 Hayashi
5,400,408 A    3/1995  Lundgren et al.
5,655,025 A    8/1997  Kim et al.
5,870,485 A    2/1999  Lundgren et al.

* cited by examiner

Primary Examiner—Minsun Oh Harvey
(74) Attorney, Agent, or Firm—Robert E. Bushnell, Esq.

(57) ABSTRACT

A portable computer system includes an audio circuit and a common audio input socket coupled to the audio circuit. This audio circuit has a controller and two amplifiers. Two types of external audio devices is to be coupled to the common audio input socket. The controller controls the two amplifiers alternately depending upon the audio type of the external audio device coupled to the common audio input socket. In a preferred embodiment, a first amplifier is provided for amplifying stereo audio signals and a second amplifier for amplifying a mono audio signal. When the controller detects a mono audio device, the microcontroller disables the first amplifier. Detecting a stereo audio device, the controller disables the second amplifier.

23 Claims, 5 Drawing Sheets

COMPUTER SYSTEM WITH A COMMON AUDIO INPUT FOR ITS AUDIO CIRCUITRY

CLAIM OF PRIORITY

This application makes reference to, incorporates the same herein, and claims all benefits accruing under 35 U.S.C. §119 from an application for Computer System With A Common Audio Input For Its Audio Circuitry earlier filed in the Korean Industrial Property Office on May 6, 1998 and there duly assigned Serial No. 16206/1998.

FIELD OF THE INVENTION

The present invention relates to a computer system, and more particularly to a portable computer system having audio circuitry and a common audio input socket for the audio circuitry.

DESCRIPTION OF THE RELATED ART

U.S. Pat. No. 5,655,025 for a Circuit For Automatically Recognizing And Receiving Mono And Stereo Audio Signals to Kim et al., discloses a circuit for automatically recognizing and receiving mono and stereo audio signals, in which a mono or a stereo connector, that is, a type of a connector which is inserted into a stereo jack is automatically recognized and an input signal transmitted via the inserted connector is transmitted to an audio processing circuit in a next stage to match the type of the connector. However, Kim et al '025 does not disclose the use of a microcontroller for turning on or off amplifiers depending on whether a mono type device or a stereo type device is connected to the input jack. In addition, the invention of Kim et al is not in a computer environment.

U.S. Pat. No. 5,870,485 for a Computer Visual Display Monitor With Integral Stereo Speaker and Directional Microphone and Method For Construction to Lundgren et al. Discloses a computer having a cathode ray tube (CRT) and integrating a high quality stereophonic speaker system and a directional microphone. However, Lundgren et al does not disclose a sound card circuitry for detecting whether an input signal is mono or stereo.

SUMMARY OF THE INVENTION

Accordingly, it is an object of the present invention to provide a computer having a smaller area for audio sockets thereof.

It is another object of the invention to provide a computer having audio circuitry with less power dissipation.

It is also another object to provide a computer having one input jack that accepts mono and stereo inputs.

It is yet another object to provide a circuit for a computer that detects whether the sound being input is stereo or mono, and switching on or off appropriate devices in the circuit automatically as needed depending on whether the input signal is mono or stereo.

It is still yet another object to provide a computer that uses a controller to detect whether the input from an audio jack is mono or stereo, and to switch on or off the appropriate amplifiers depending on whether the input signal is mono or stereo to reduce power dissipation.

These and other objects of the present invention are achieved by providing a computer which has a common audio input socket that can be commonly coupled to individual audio functional blocks within an audio circuit thereof. The audio input socket can be connected with either of a first type audio device and a second type audio device. The first and second type audio devices generate a first and second type audio signals different from each other. The audio circuit includes a first and second amplifiers for amplifying the first and second type audio signals, respectively. A controller is further provided for checking whether the first type audio device is coupled to the audio input socket or the second audio device is coupled to the audio input socket. The controller also controls the first and the second amplifiers alternately depending upon the alternate connection of the first and second type audio devices.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
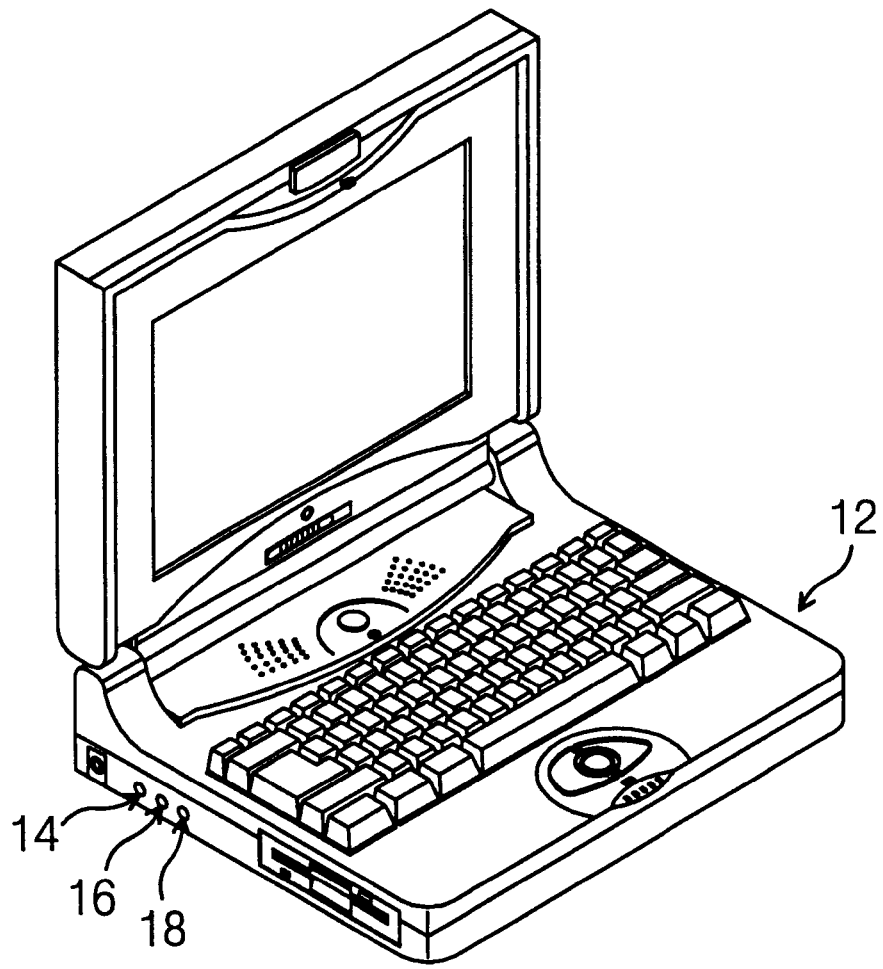
FIG. 1 is a perspective view illustrating a conventional portable computer.

FIG. 1 is a perspective view which illustrates a conventional portable computer. Referring to FIG. 1, the conventional portable computer 10 comprises several connectors such as a COM port connector and an LPT port connector, and sockets such as a headphone socket 14, an audio line input (line-in) socket 16 and a microphone socket 18, which are usually placed on the side of a base housing 12 of the computer 10, as shown in the figure.

As portable computers become smaller and slimmer, there arises the problem of how to acquire areas for their essential connectors and sockets. This becomes more serious for the state-of-the-art portable computers which tend to be equipped with almost all available auxiliary devices (for example, FDD, HDD, CD-ROM drive, PCMCIA memory card and/or modem, and IR transceiver) and a variety of essential connectors (for example, COM port connector, LPT port connector, monitor connector, TV connector, keyboard connector, one or more USB port connectors). If there is insufficient room for the connectors and sockets, subordinate audio sockets may first be removed rather than the essential connectors.

However, the current computer design trend toward multimedia applications will not permit the audio sockets to be omitted since the elimination of any audio socket(s) from a computer means the removal of specific audio function(s) therefrom. For example, if there is no audio line-in socket, then external audio devices, such as stereo audio CD players, stereo radio receivers and stereo cassette tape players, will not be able to be used for the computer. Similarly, if there is no microphone or headphone socket, external microphones or headphones cannot be used for the computer.

Figure 2:
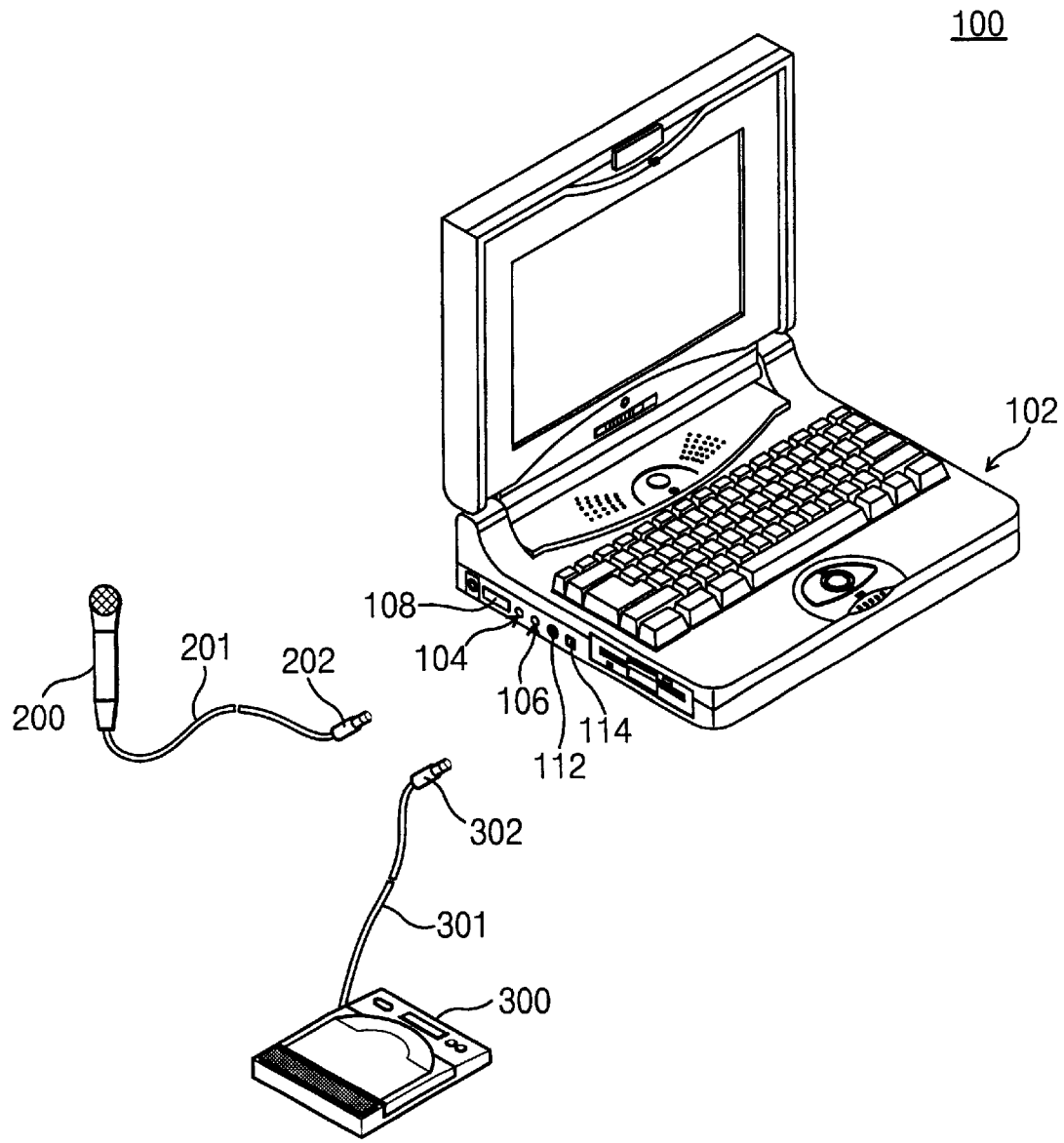
FIG. 2 is a perspective view illustrating a portable computer having a common audio input socket in accordance with an embodiment of the present invention.

FIG. 2 illustrates a portable computer according to an embodiment of the present invention. Referring to FIG. 2, the portable computer 100 has an audio output socket 104 such as headphone socket, a common audio input socket 106, a PCMCIA memory card and/or modem connector 108, an infrared transceiver port 112, and one or more universal serial bus (USB) port connector 114. The portable computer 100 also includes COM port connector, LPT port connector, monitor connector and/or TV connector, keyboard connector, etc, although not shown in the FIG. 2. The audio output socket 104 and the common audio input socket 106 are electrically coupled to a novel audio circuit of the invention which will be described in detail later with reference FIG. 3. The audio output socket 104 and the common audio input socket 106 provide for all functions of the audio circuit despite the miniaturization of the computer.

Audio devices may be generally classified as monaural, binaural, stereophonic, or quadraphonic, from the channel point of view. The most commonly used devices are monaural and stereophonic. Monaural ("mono") audio devices for generating mono signals, transmit sound signals on a single transducing channel. For example, microphone 200 is involved in the mono audio device. Stereophonic ("stereo") audio devices for generating stereo signals, transmit sound signals on at least two transducing channels (L and R) which are themselves coupled to at least two loudspeakers.

Two different sound types of external audio devices of the portable computer 100, i.e., a mono type of audio device 200, such as a microphone, and a stereo type of audio device 300, such as an audio CD player, an FM radio receiver or a tape cassette player, can be coupled through the common audio input socket 106 to the audio circuitry of the computer 100. Being used together with the computer 100, such audio devices may generally be coupled to the computer 100 using signal cables 201 and 301. The signal cables 201 and 301 are provided with plugs 202 and 302 at their one ends, respectively. The plugs 202 and 302 are plugged in the common audio input socket 106 which is substituted for the conventional microphone socket and audio line-in socket of FIG. 1 in order to reduce the number of the sockets related to the audio functions.

Figure 3:
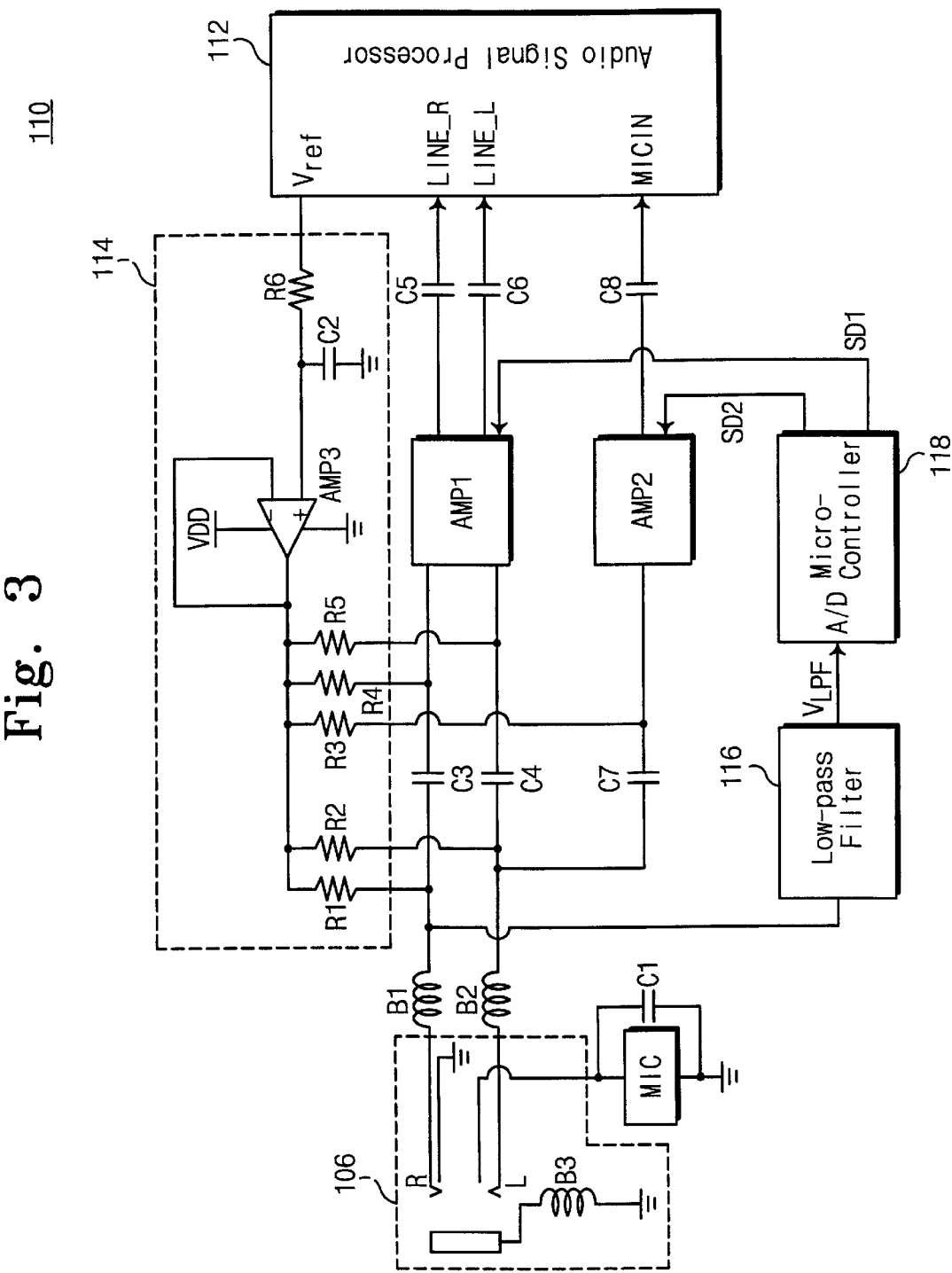
FIG. 3 is a circuit diagram illustrating an audio circuit of the portable computer shown in FIG. 2.
Figure 4A:
FIG. 4A is a diagram illustrating the output voltage of the low-pass filter when a first type of external audio device is coupled to the audio circuit through the audio input socket of FIG. 3.
Figure 4B:
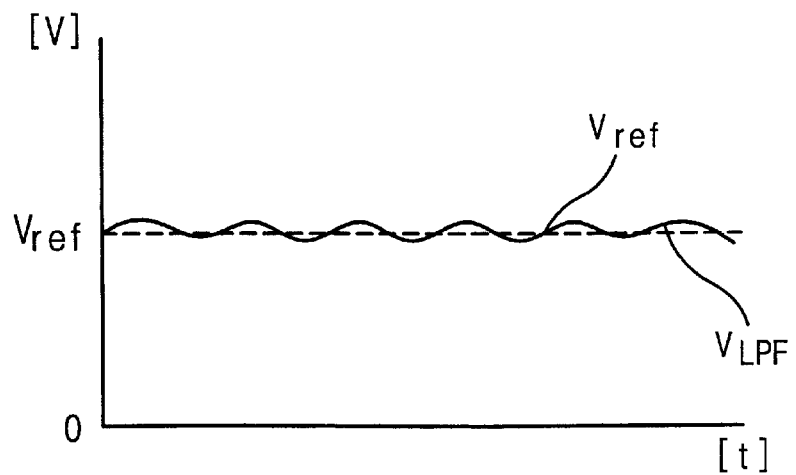
FIG. 4B is a diagram illustrating the output voltage of the low-pass filter when a second type of external audio device is coupled to the audio circuit through the audio input socket of FIG. 3.

FIG. 3 is a circuit diagram illustrating a novel audio circuit 110 of the portable computer system 100 shown in FIG. 2. FIG. 4A and FIG. 4B illustrate waveforms of respective low-pass filtered signals, which correspond to the audio type i.e., mono or stereo, of an audio device coupled to the audio input socket 106 on the computer system 100.

Referring to FIG. 3, the audio circuit 110 is coupled to the common audio input socket 106 through a signal cable. This socket 106 has two channel input terminals, i.e., a right terminal R and a left terminal L. The audio circuit 110 also includes an audio signal processor 112 for processing a variety of audio signals, a voltage follower 114, a first amplifier circuit AMPI for amplifying stereo signals and a second amplifier circuit AMP2 for amplifying a mono signal. The audio signal processor 112 is a single-chip audio system for audio signal processing, such as ISA bus interface, digital audio processing, MIDI interface, coding-decoding (CODEC), mixing, FM synthesizer interface, volume control, etc. The voltage follower 114 is formed of an operational amplifier AMP3, resistors R1 through R6, and a capacitor C2. The audio signal processor 112 supplies a reference voltage $V_{ref}$ (e.g., 2.25 volts) to the voltage follower 114 which provides several bias voltages onto the signal input lines of the amplifier circuits AMP1 and AMP2.

The audio circuit 110 further includes a low-pass filter 116 and a microcontroller (or microcomputer) 118 having an embedded analog-to-digital (A/D) converter. The low-pass filter 116 is applied with an audio signal from one of channel input terminal (e.g., right input R) of the audio input socket 106 and provides a filtered audio signal $V_{LPF}$ to the microcontroller 118 while an external audio device is connected to the portable computer system 100 through the socket 106. In addition, the audio circuit 110 comprises inductors B1 and B2 whose one ends are coupled to the right and left input terminals R and L, respectively. The other ends of the inductors B1 and B2 are coupled to two inputs of the amplifier circuit AMP1 via the coupling capacitors C3 and C4, respectively. Two outputs of the amplifier circuit AMP1 are coupled through coupling capacitors C5 and C6 to right and left line input terminals LINE_R and LINE_L of the audio signal processor 112, respectively. An input of the amplifier circuit AMP2 is connected to the inductor B2 through a coupling capacitor C7 and an output thereof is connected through a coupling capacitor C8 to a microphone input MICIN of the audio signal processor 112. The audio signal processor 112 has an embedded A/D converter (not shown), like the microcontroller 118. a signal cable (see 201 and 301 of FIG. 2). The cable is provided with a plug at its one end. If the audio device is a mono type device 200 such as a microphone, a mono type plug 202 will be used therefor. If, however, the audio device is a stereo type device 300 such as an audio CD player, a stereo type plug 302 will be used therefor. The stereo audio device 300 has two channels (i.e., right-channel R and left-channel L). The mono audio device 200 has only one channel (generally, left-channel L).

When the mono audio device 200 is connected to the portable computer 100 by connecting its mono type plug 202 with the audio input socket 106 of the computer 100, the right channel R of the audio input socket 106 is grounded, which allows the low-pass filter 116 to output the voltage $V_{LPF}$ of 0 volt as shown in FIG. 4a. In contrast, when the stereo audio device 300 is connected to the computer 100 by connecting its stereo type plug 302 with the audio input socket 106, the right channel R of the audio input socket 106 is not grounded, making the low-pass filter 116 output the voltage $V_{LPF}$ biased by the reference voltage $V_{ref}$ (i.e., 2.25 volts) as shown in FIG. 4b.

The microcontroher 118 receives the output voltage $V_{LPF}$ of the low-pass filter 116 through its embedded A/D convertor and detects the audio type of the coupled audio device depending upon the level of the voltage $V_{LPF}$.

Figure 5:
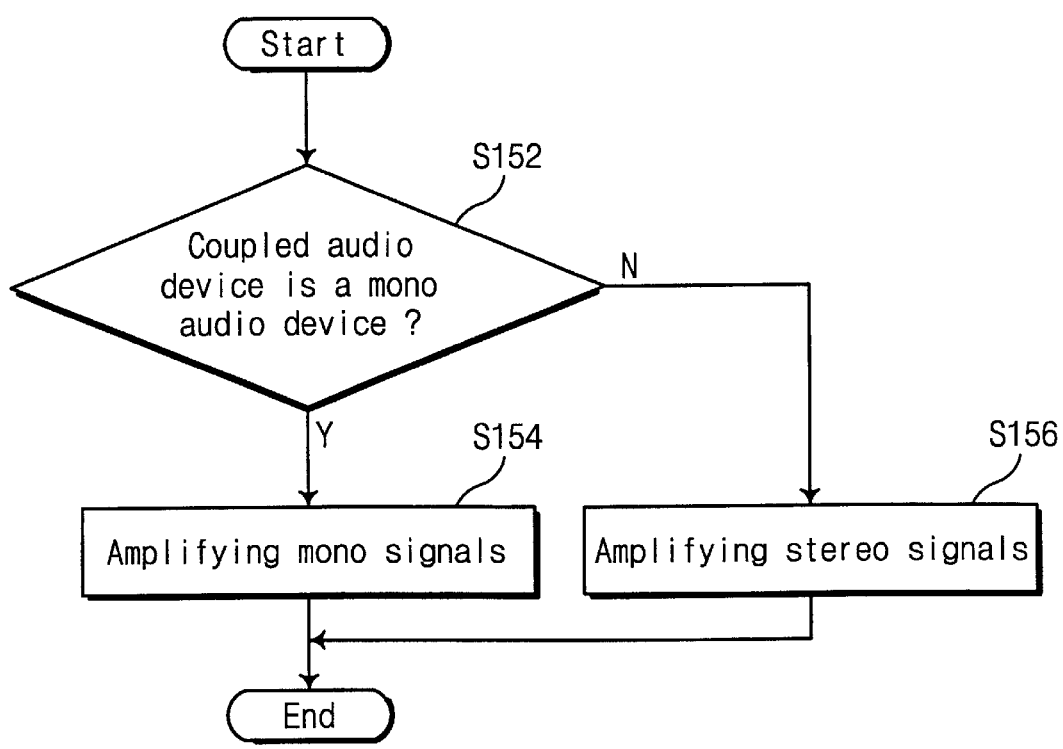
FIG. 5 is a flowchart for the control operation of the microcontroller of FIG. 3.

FIG. 5 is a flowchart which illustrates the control operation of the microcontroller 118 shown in FIG. 3. Referring to FIG. 5, at step S152, the microcontroller 118 checks whether the coupled audio device is the mono audio device or not by detecting the level of the output voltage $V_{LPF}$ of the low-pass filter 116. For a stable and frequent detection of the coupled audio device type, the microcontroller 118 has a reasonable sampling time (e.g., 1 sec). When the output voltage level of the low-pass filter 116 is low (about 0 volts) in step S152, the microcontroller 118 identifies the connected audio device is a mono audio device such as a microphone. In contrast, when the output voltage level of the low-pass filter is high (about 2.25 volts), the microcontroller 118 identifies the connected audio device as a stereo audio device.

At step S152, if the connected audio device is identified as a mono audio device, then control flow advances to the next step S154, wherein the microcontroller 118 generates a first control signal SD1 to disable the first amplifier AMP1 from operating. Thus, only the mono signal from the mono audio device is amplified by the second amplifier circuit AMP2. The amplified mono signal is transmitted to the microphone input MICIN of the audio signal processor 112 through the coupling it capacitor C8.

Also, if a mono audio device is not detected in step S152, e.g., when the connected audio device is identified as a stereo audio device, flow proceeds to step S156, wherein the microcontroller 118 generates a second control signal SD2 to disable the second amplifier AMP2. Thus, the stereo signals related to the two channels (i.e., right-channel R and left-channel L) from the stereo audio device, are amplified by the first amplifier circuit AMP1. The amplified stereo signals are provided to the input terminals LINE_R and LINE_L of the audio signal processor 112 via coupling capacitors C5 and C6, respectively.

As described above, the portable computer 100 according to the present invention, can provide almost all audio functions without limitation due to the miniaturization thereof, by coupling the mono or the stereo type audio device through the common audio input socket 106. In addition, the portable computer dissipates less power by selectively operating the amplifier circuits AMP1 and AMP2 corresponding to the coupled audio device type.

While the invention has been described in terms of an exemplary embodiment, it is contemplated that it may be practiced as outlined above with modifications within the spirit and scope of the appended claims.

What is claimed is:

1. A computer system having an audio circuit, comprising:
   an audio input socket for electrically connecting either of a first type audio device and a second type audio device, the first and second type audio devices generating a first and second type audio signals;
   a first amplifier for amplifying the first type audio signal;
   a second amplifier for amplifying the second type audio signal; and
   a controller for checking whether the first type audio device is coupled to the audio input socket or the second audio device is coupled to the audio input socket, and alternately controlling the first and the second amplifiers depending upon the alternate connection of the first and second type audio devices, said controller always disabling only one of said first and said second amplifier based on whether said first or said second type audio signal is input to said audio input socket.

2. The computer system according to the claim 1, wherein the first and the second type audio devices generate mono and stereo audio signals, respectively.

3. The computer system according to the claim 2, wherein the first type audio device is a microphone.

4. The computer system according to the claim 2, wherein the second type audio device is one among a CD player, a radio receiver and a tape cassette player.

5. The system of claim 2, said controller outputs a second control signal to disable said second amplifier when said stereo audio signals are input to said audio input socket.

6. The system of claim 2, said first amplifier is always used to amplify audio signals when mono signals are input into said audio input jack.

7. The system of claim 1, said controller outputs a first control signal to said first amplifier to disable said first amplifier when said first type audio signal is input in said audio input socket.

8. The system of claim 7, said first control signal not being an audio signal.

9. The system of claim 1, said system further comprising an audio signal processor connected to an output of said first and said second amplifiers.

10. A sound card for a computer that automatically recognizes and receives mono and stereo signals, comprising:
    an audio input socket for connecting either mono or stereo type devices;
    a first amplifier for amplifying mono type audio signals;
    a second amplifier for amplifying stereo type audio signals; and
    a microcontroller for switching off said second amplifier when a mono type device is connected to said audio input socket and for switching off said first amplifier when a stereo type device is connected to said audio input socket.

11. The sound card of claim 10, further comprising a low-pass filter having an input and an output, said output being connected to said microcontroller, said output signal depending on whether a mono type device or a stereo type device is connected to said audio input socket of said sound card.

12. The sound card of claim 11, wherein said output signal of said low-pass filter has a voltage signal of zero if a mono type device is connected to said audio input socket and has a voltage signal equal to a reference voltage if a stereo type device is connected to said audio input socket.

13. The sound card of claim 10, wherein said audio input socket includes a right input channel and a left input channel, the right input channel being grounded when a mono input device is connected to said audio input socket.

14. The sound card of claim 13, wherein said right input channel is connected to said input of said low-pass filter causing said output of said low-pass filter to output a zero voltage when a mono type device is connected to said audio input socket.

15. The sound card of claim 10, wherein said mono type device includes a microphone.

16. The sound card of claim 10, wherein said stereo type device includes a CD player.

17. A computer system having a sound card, comprising:
    an audio input jack having a right input channel and a left input channel, said audio input jack accommodating both mono type devices as well as stereo type devices, said right channel of said audio input jack being grounded when a mono type device is connected to said audio input jack;
    a first amplifier for amplifying stereo type device audio signals;
    a second amplifier for amplifying mono type device audio signals; and
    a controller for switching off said first amplifier when a mono type device is connected to said audio input jack and switching off said second amplifier when a stereo type device is connected to said audio input jack, said controller being controlled by a voltage generated at said right input channel of said audio input jack.

18. The computer system of claim 17, wherein said second amplifier is connected between said left input channel of said audio input jack and a microphone input terminal of an audio signal processor.

19. The computer system of claim 17, wherein said first amplifier has an input and an output, said input being said left and right input channels of said audio input jack and said output being an audio signal processor.

20. The computer system of claim 17, further comprising a low pass filter having an input and an output, said input being connected to said right input channel of said audio input jack and said output being connected to said controller.

21. The computer system of claim 17, wherein said mono type device includes a microphone.

22. The computer system of claim 17, wherein said stereo type device includes a CD player.

23. A computer system having an audio circuit, comprising:

an audio input socket for electrically connecting either of a first type audio device and a second type audio device, the first and second type audio devices generating a first and second type audio signals;

a first amplifier for amplifying the first type audio signal;

a second amplifier for amplifying the second type audio signal; and a controller for checking whether the first type audio device is coupled to the audio input socket or the second audio device is coupled to the audio input socket, and alternately controlling the first and the second amplifiers depending upon the alternate connection of the first and second type audio devices, each of said first and said second amplifiers having two inputs and one output, one of said two inputs being a control signal that is used to disable the amplifier, said control signal not being an audio signal.

\* \* \* \* \*